United States Patent [19]
Maldonado

[11] Patent Number: 5,812,094
[45] Date of Patent: Sep. 22, 1998

[54] ANTENNA COUPLER FOR A PORTABLE RADIOTELEPHONE

[75] Inventor: David Maldonado, San Diego, Calif.

[73] Assignee: Qualcomm Incorporated, San Diego, Calif.

[21] Appl. No.: 626,786

[22] Filed: Apr. 2, 1996

[51] Int. Cl.⁶ .................................................. H01Q 1/24
[52] U.S. Cl. ........................ 343/702; 343/841; 343/906
[58] Field of Search .................................. 343/702, 906, 343/713, 715, 841, 895; 455/89, 90; H01Q 1/24

[56] References Cited

U.S. PATENT DOCUMENTS

| | | | |
|---|---|---|---|
| 3,337,280 | 8/1967 | Joseph et al. | 343/702 |
| 3,349,405 | 10/1967 | Wright | 343/702 |
| 4,220,955 | 9/1980 | Frye | 343/703 |
| 5,158,483 | 10/1992 | Fishman et al. | 439/668 |
| 5,289,199 | 2/1994 | Viereck | 343/745 |
| 5,304,998 | 4/1994 | Lopez | 343/767 |
| 5,343,214 | 8/1994 | Hadzoglou | 343/713 |
| 5,374,937 | 12/1994 | Tsunekawa et al. | 343/702 |
| 5,493,702 | 2/1996 | Crowley et al. | 455/89 |
| 5,557,287 | 9/1996 | Pottala et al. | 343/702 |

FOREIGN PATENT DOCUMENTS 0827971  10/1996  Japan .............................. H01Q 1/24

*Primary Examiner*—Hoanganh T. Le
*Attorney, Agent, or Firm*—Russell B Miller; Roger W. Martin

[57] ABSTRACT

A novel and improved antenna coupler useful in an adapter for a portable radiotelephone. In a first embodiment, a plurality of curved bands of metal are positioned on a ground plane, with at least one of the plurality of curved bands of metal being electrically isolated from the ground plane so as to couple RF signals to and from the antenna of a portable telephone. At least one ground pin is also mounted on the ground plane. When a portable radiotelephone is interfaced with the antenna coupler, the at least one ground pin makes electrical contact with assembly screws or an external ground pad of a battery charging port on the portable radiotelephone. In a second embodiment, a coupling pin makes direct contact with an component of the RF chain of the portable radiotelephone. In a third embodiment, a helical coupler surrounds the antenna of the portable radiotelephone.

23 Claims, 4 Drawing Sheets

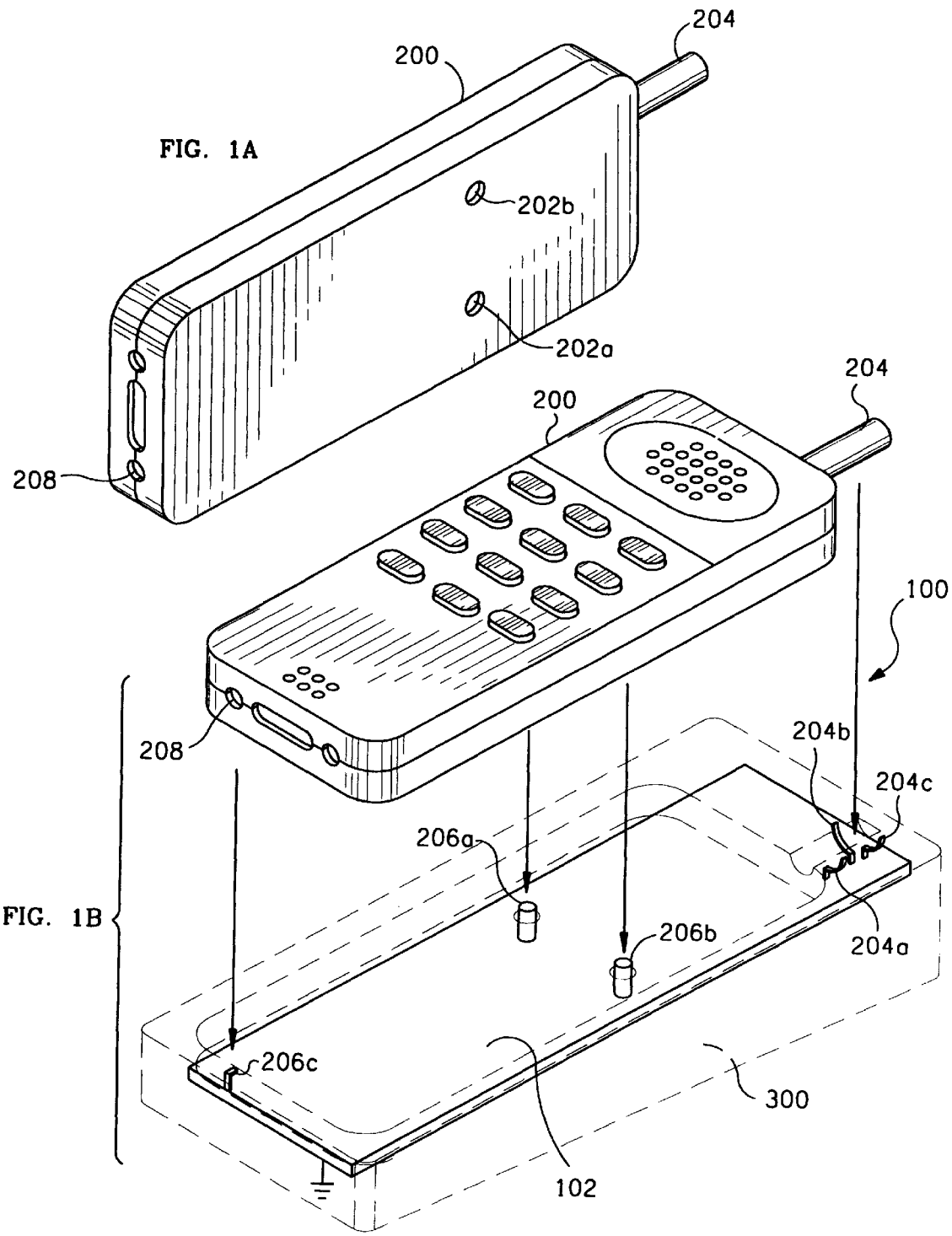

ANTENNA COUPLER FOR A PORTABLE RADIOTELEPHONE

BACKGROUND OF THE INVENTION

I. Field of the Invention

The present invention relates generally to antenna couplers. More particularly, the present invention is directed to a novel and improved antenna coupler for a portable radiotelephone.

II. Description of the Related Art

In the field of cellular communications, portable radiotelephones are used to communicate with base stations over radio-frequencies (RF). Typically, these portable radiotelephones operate at relatively low power levels in order to conserve battery power and increase talk time. However, when there are alternate power means available, such as a vehicle battery when driving, or a conventional electrical outlet when indoors, the user of the portable radiotelephone often employs special adapters to take advantage of the higher power supply available. For example, there are many vehicular adapters which transform the vehicle-generated electrical supply into a level suitable for use by the portable telephone, and also couple the RF signals to and from the portable radiotelephone for use with an external power booster and antenna. Additionally, these adapters may include a "hands-free" kit including an auxiliary microphone and speaker. In this way, the user may take advantage of higher power transmission and hands-free conversation without sacrificing battery time, and yet still be able to carry the same portable radiotelephone with him when he leaves his car.

In order to couple the RF signal to and from the portable radiotelephone, a typical vehicular adapter uses an inductive coupler placed close to the portable radiotelephone's antenna. However, this technique may result in a significant amount of RF signal energy loss, particularly when an insufficient RF return path, or ground, is provided to the portable radiotelephone while it is in the adapter. Since a typical portable radiotelephone's internal components are encased in an electromagnetic interference (EMI) shield to prevent stray electromagnetic energy leaking from the radiotelephone's casing, the prior art vehicular adapters have not been able to achieve a sufficient RF return path to the portable radiotelephone.

SUMMARY OF THE INVENTION

The present invention is a novel and improved antenna coupler useful in an adapter for a portable radiotelephone. In a first embodiment, a plurality of curved bands of metal are positioned on a ground plane base, with at least one of the plurality of curved bands of metal being electrically isolated from the ground plane so as to couple RF signals to and from the antenna of a portable telephone. At least one ground pin is also mounted on the ground plane base. When a portable radiotelephone is interfaced with the antenna coupler, the at least one ground pin makes electrical contact with assembly screws on the portable radiotelephone. Since the assembly screws penetrate the EMI shield, a complete RP ground return path is provided to the portable radiotelephone. Optionally, a ground pin makes direct electrical contact with an external ground pad of a battery charging port of the portable radiotelephone, providing an alternate means of coupling the ground of the radiotelephone to the ground plane of the antenna coupler.

In a second embodiment, a coupling pin makes direct contact with a component of the RF chain of the portable radiotelephone, such as the portable radiotelephone's antenna. In the second embodiment, there is no need for coupling the signal over the air by the curved bands of metal. In a third embodiment, a helical coupler surrounds the antenna of the portable radiotelephone, coupling RF signals over the air.

RF signals coupled from the portable radiotelephone's antenna by the antenna coupler of the present invention are passed through an impedance matching circuit, and optionally to a power booster, where they are subsequently transmitted on an external auxiliary antenna. In a converse manner, signals received by the external auxiliary antenna are coupled to the' portable radiotelephone by the antenna coupler of the present invention.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 1A is an illustration of an exemplary portable radiotelephone suitable for use with the present invention;

FIG. 1B is an illustration of a first embodiment antenna coupler of the present invention interfacing with an exemplary portable radiotelephone;

DETAILED DESCRIPTION OF THE PREFERRED EMBODIMENTS

Figure 2A:
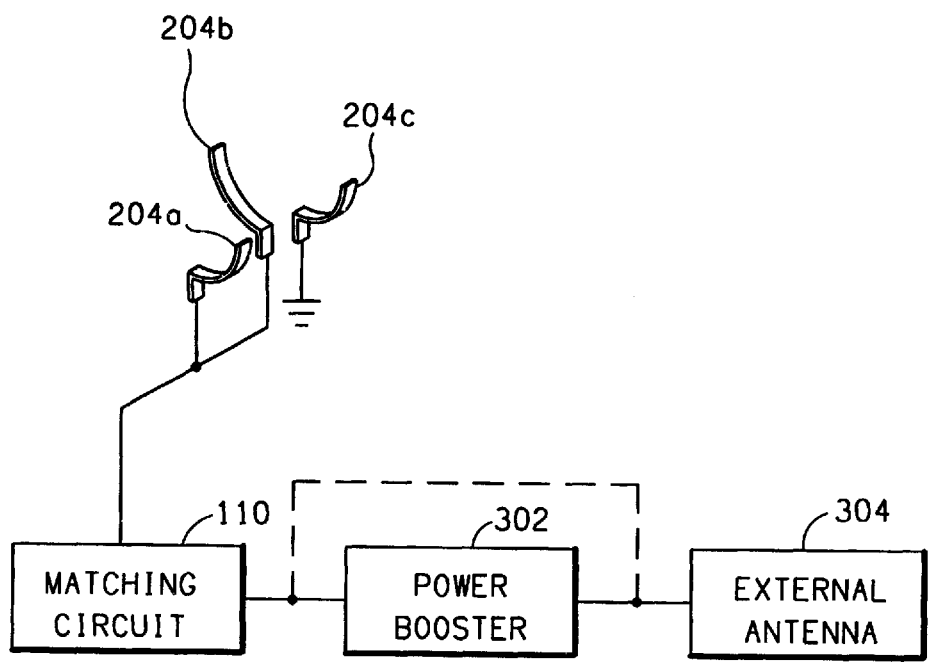
FIG. 2A is an illustration of one embodiment of the coupling elements of the present invention.

Referring to FIG. 1B, a first embodiment of the antenna coupler 100 of the present invention comprises ground plane 102, coupling elements 204a, 204b, and 204c, ground pins 206a, and 206b, and optional ground pin 206c. Coupling elements 204a, 204b, and 204c are preferably constructed of vertically facing, curved bands of a conductive material, such as copper, steel, or the like. When portable radiotelephone 200 is interfaced with antenna coupler 100, coupling elements 204a, 204b, and 204c receive retracted helix antenna 204 of portable radiotelephone 200 and couple RF signals to and from antenna 204. Coupling elements 204a, 204b, and 204c are constructed and positioned in such a way that when portable radiotelephone 200 is interfaced with antenna coupler 100, coupling elements 204a, 204b, and 204c extend in a semi-circular array, each covering one-quarter of the circumference of antenna 204. It should be noted that antenna 204 may also be of a non-helical construction as is known in the art, such as a rod or loop antenna. It should also be noted that portable radiotelephone 200 may generally be any type of mobile communication device, such as a cellular or PCS radiotelephone, or a wireless local loop communication device.

Coupling elements 204a, 204b, and 204c are mounted at a respective coupler base to ground plane 102. In the preferred embodiment, ground plane 102 is a double-sided printed wiring board (PWB). However, a single-sided PWB would also provide an adequate construction for ground plane 102, or any large base coated with a layer of conductive material. In order to couple RF energy from antenna 204, at least one of coupling elements 204a, 204b, and 204c is electrically isolated from ground plane 102. Ground plane 102 also serves to electrically couple ground pins 206a, 206b, and (optionally) 206c to at least one of coupling elements 204a, 204b, and 204c. That is to say that each of ground pins 206a–206c, ground plane 102, and at least one of coupling elements 204a–204c share the same electrical ground potential. As such, a complete RF signal path may be provided for coupling of RF signals to and from antenna 204 by connecting ground pins 206a, 206b, and (optionally) 206c to a suitable ground on portable radiotelephone 200.

An exemplary connection scheme of the coupling elements 204a–204c of the present invention is seen in FIG. 2A. In FIG. 2A, coupling elements 204a and 204b are connected together, and electrically isolated from ground plane 102, while connector 204c is connected directly to ground plane 102. For signal transmission utilizing the present invention, RF signals from portable radiotelephone 200 (see FIG. 1B) are transmitted over the air by antenna 204. Coupling elements 204a and 204b couple off the RF energy from antenna 204 and pass it to matching circuit 110 which provides an impedance match between power booster 302 and antenna coupler 100. Optional power booster 302 increases the power of the RF signal coupled from antenna 204 and passes the resulting high-power signal to external antenna 304 for over-the-air transmission. For reception, the reverse signal flow occurs. RF signals received by external antenna 304 are optionally passed through power booster 302 and matching circuit 110 to coupling elements 204a and 204b where the signal energy is coupled to antenna 204 of portable radiotelephone 200.

Figure 2B:
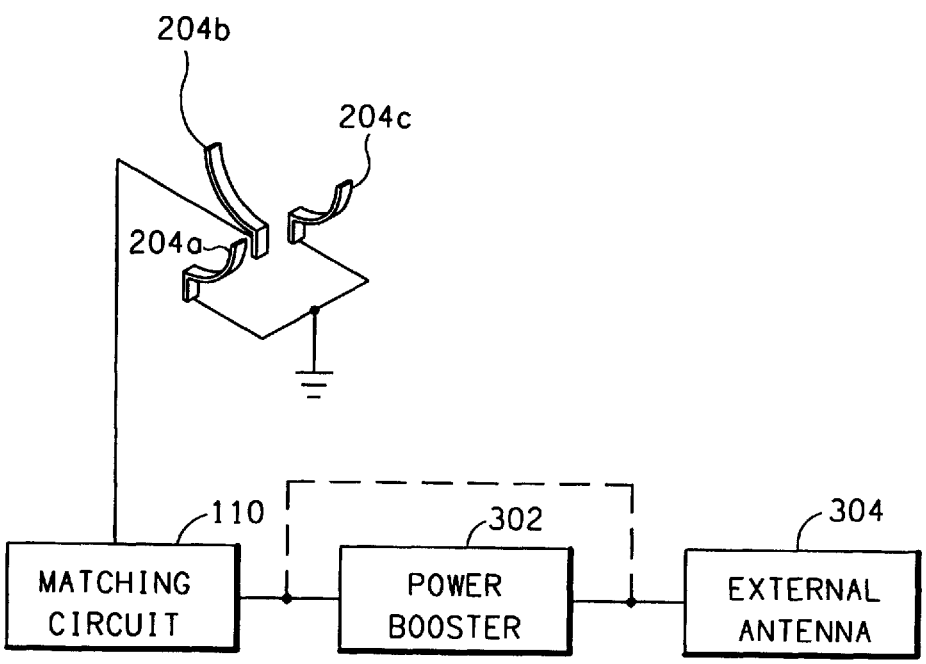
FIG. 2B is an illustration of an alternate embodiment of the coupling elements of the present invention.

An alternative connection scheme of the coupling elements 204a–204c is illustrated in FIG. 2B. FIG. 2B is similar to FIG. 2A, except that it is the outer two coupling elements, 204a and 204c which are both connected to ground plane 102, and only the inner coupling element 204b is electrically isolated from ground plane 102 and connected to matching circuit 110. This alternative arrangement of FIG. 2B has different RF characteristics than that of FIG. 2A, and may be more suitable for different operating frequency ranges or antenna structures.

Referring now to FIG. 1B, ground pins 206a and 206b make electrical contact with assembly screws 202a and 202b (see FIG. 1A) of portable radiotelephone 200. Since these assembly screws penetrate the internal electromagnetic shield (not shown) enclosing the internal components of portable radiotelephone 200, they improve the contact between the ground of antenna coupler 100 and portable radiotelephone 200. Although there is typically no direct contact between the assembly screws 202a and 202b of portable radiotelephone 200 and the internal electromagnetic interference (EMI) shield (not shown), the screws pass through the edges of the shield, providing sufficient ground potential. In the preferred embodiment, ground pins 206a and 206b are spring-loaded to ensure reliable contact with assembly screws 202a and 202b. Alternatively, radiotelephone 200 may be designed such that assembly screws 202a and 202b make direct physical contact with the internal EMI shield.

Direct contact may also be made between the ground plane 102 and the internal ground of portable radiotelephone 200 through ground pin 206c, which makes contact with battery ground port 208 of portable radiotelephone 200. In this optional configuration, coupling between the internal ground of portable radiotelephone 200 and ground plane 102 may also be accomplished. It should be understood that although the exemplary embodiment illustrated in FIG. 1 comprises three ground pins 206a, 206b, and 206c, alternate embodiments may comprise more or fewer pins to accomplish the same function.

Figure 3A:
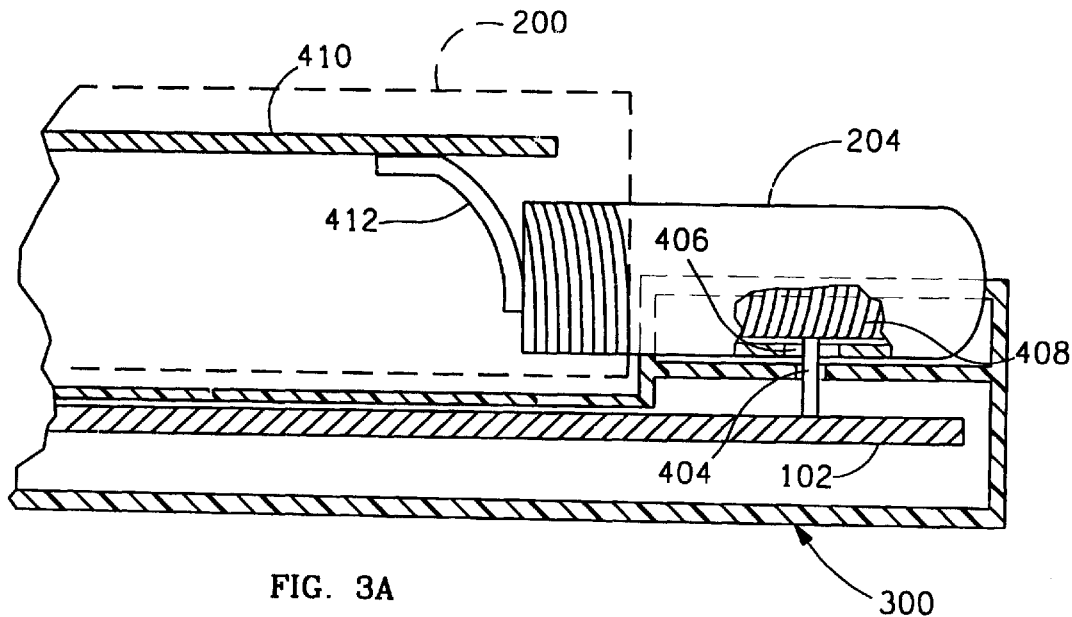
FIG. 3A is an illustration of a second embodiment of the antenna coupler of the present invention interfacing with a direct connection to an exemplary portable radiotelephone antenna, shown in a partially cut-away view.
Figure 3B:
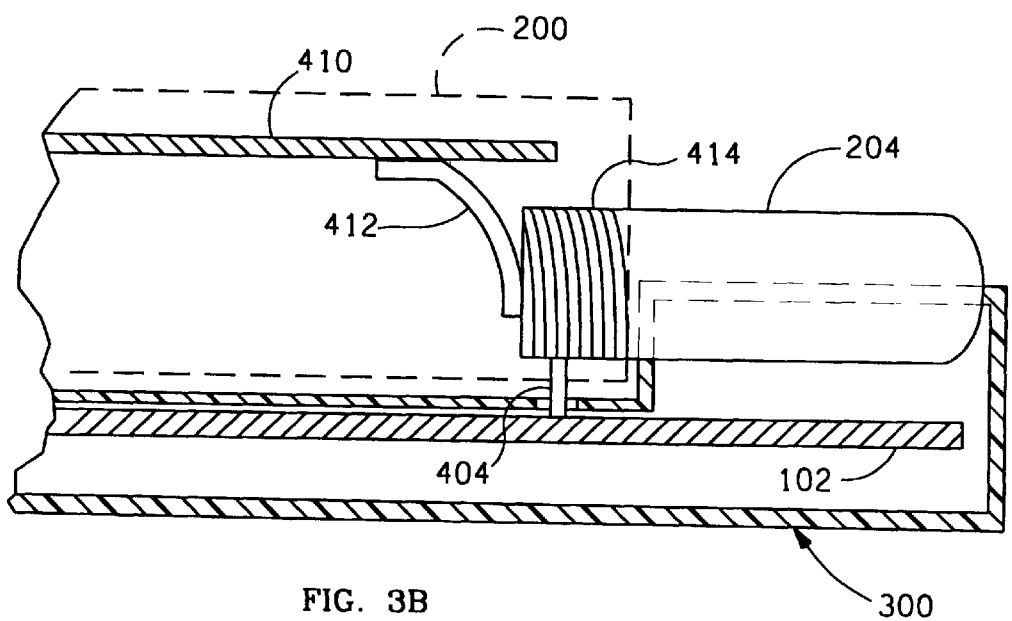
FIG. 3B is an illustration of a second embodiment of the coupling elements of the present invention interfacing with a direct connection to an internal component of an exemplary portable radiotelephone.

In a second embodiment of the antenna coupler of the present invention shown in FIGS. 3A and 3B, coupling elements 204a, 204b, and 204c of FIG. 1 are replaced with a direct contact coupling pin 404. Direct contact coupling pin 404 is mounted to, but electrically isolated from, ground plane 102. Direct contact coupling pin 404 makes physical contact with an internal component in the RF chain of radiotelephone 200. For example, if antenna 204 is encased in an insulative material, such as plastic, direct contact coupling pin 404 makes physical contact with the internal electrically conductive portion 408 of antenna 204 through a small opening 406 in the outer protective casing of antenna 204, as shown in FIG. 3A. Alternatively, portable radiotelephone 200 may have a small opening in its protective casing for direct contact coupling pin 404 to make physical contact with antenna nut 414 or antenna clip 412, or any suitable component in the RF chain of circuit board 410, all internal to portable radiotelephone 200. Direct contact of coupling pin 404 to an internal component in the RF chain of radiotelephone 200 as shown in either FIG. 3A or 3B obviates the need for the multiple coupler configuration associated with over-the-air coupling as shown in FIGS. 1 and 2. Again, it should be noted that antenna 204 may be of a non-helical design such as a rod or loop or other antenna design as is known in the art.

Figure 4A:
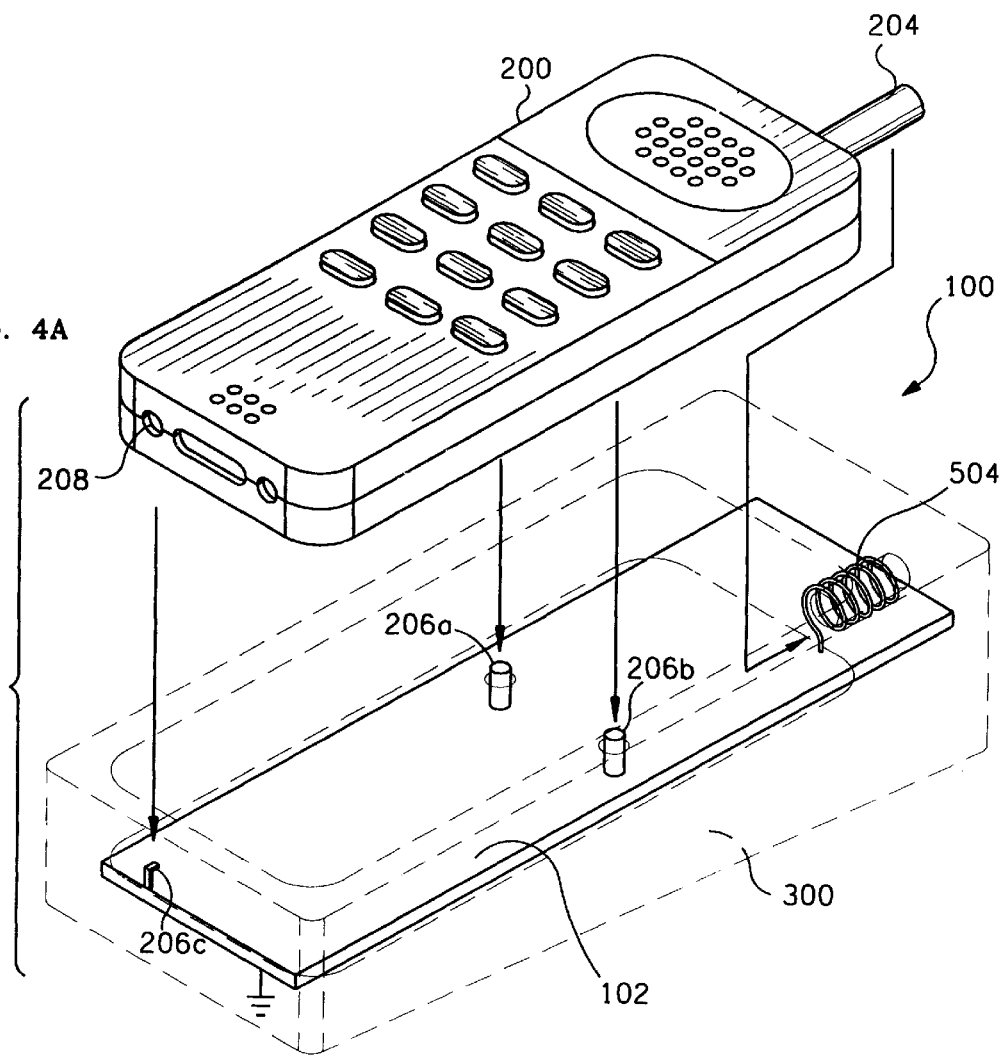
FIG. 4A is an illustration of a third embodiment antenna coupler of the present invention interfacing with an exemplary portable radiotelephone.
Figure 4B:
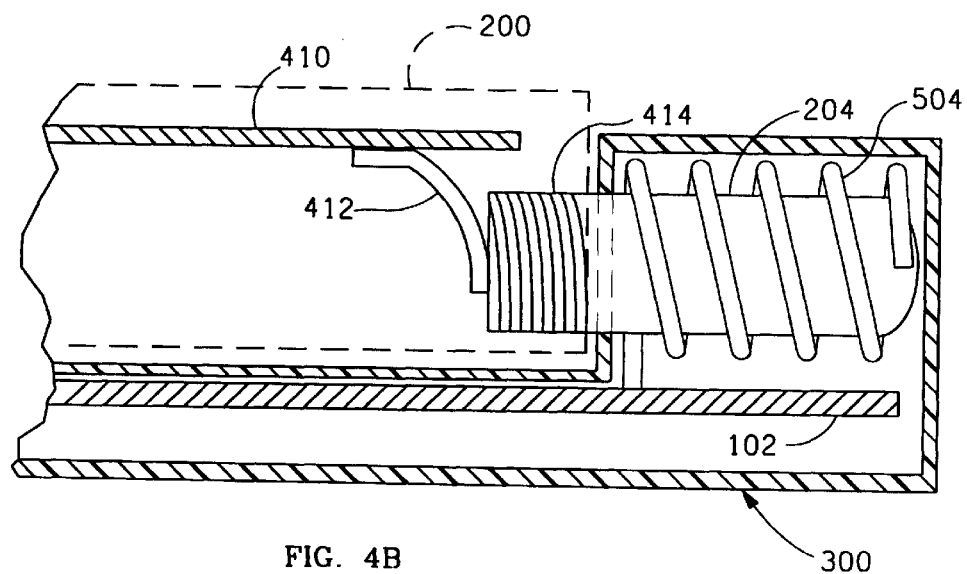
FIG. 4B is an illustration of the helical coupler of the third embodiment of the present invention interfacing with an antenna of an exemplary portable radiotelephone.

In a third embodiment of the antenna coupler 100 shown in FIGS. 4A and 4B, coupling elements 204a–204c may be replaced by a helical coupler 504. In this embodiment, when portable radiotelephone 200 is interfaced with antenna coupler 100, antenna 204 is inserted along a longitudinal axis within helical coupler 504. Helical coupler 504 is preferably constructed from a conductive wire such as copper, steel, or the like. RF coupling is accomplished over the air, similarly to that of coupling elements 204a–204c. However, in contrast to the semi-circular array arrangement of coupling elements 204a–204c as shown in FIG. 1, helical coupler 504 completely surrounds antenna 204. Also, helical coupler 504 is electrically isolated from ground plane 102. The embodiment of FIGS. 4A and 4B has different RF characteristics than that of FIGS. 1 or 3A and 3B, and may be more suitable for different operating frequency ranges or antenna structures.

In each of the above embodiments, antenna coupler 100 may be encased in a plastic or other non-conductive housing assembly 300 or the like in order to protect coupling elements 204a–204c, ground pins 206a–206c and ground plane 102 from damage, and to provide support for the structure of antenna coupler 100. Preferably, the housing assembly 300 encasing antenna coupler 100 would have a receptacle on a top face for receiving and securely capturing the portable radiotelephone 200 such that antenna 204 is brought within close proximity to coupling elements 204a–204c, and ground pins 206a–206c are physically aligned with, and securely mate with, the externally accessible grounds on portable radiotelephone 200, i.e. assembly screws 202 and/or battery ground port 206. Clearly, many different designs for the housing assembly 300 may be used without departing from the inventive concept of the present invention. For example, the housing assembly 300 may be fixedly mounted to a vehicle dash board. Alternatively, housing assembly 300 may be a more portable hand-held design that may be held close to the user's head.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An antenna coupler for coupling radio frequency signals from a communication device having an antenna and at least one externally accessible ground point, said antenna coupler comprising:
   a ground plane;
   means, mounted on a top face of said ground plane, for coupling radio signals to and from said antenna; and
   at least one ground pin, coupled to said top face of said ground plane, for contacting said externally accessible ground point.

2. The antenna coupler of claim 1 wherein said means for coupling comprises a plurality of upward facing curved bands of metal, at least one of said curved bands of metal being electrically isolated from said ground plane.

3. The antenna coupler of claim 2 wherein said externally accessible ground point is an assembly screw which penetrates an internal electromagnetic shield of said portable radiotelephone.

4. The antenna coupler of claim 2 wherein said externally accessible ground point is a ground pad of a battery charging port.

5. The antenna coupler of claim 1 wherein said means for coupling comprises a metal pin for physically contacting said antenna.

6. The antenna coupler of claim 5 wherein said externally accessible ground point is an assembly screw which penetrates an internal electromagnetic shield of said portable radiotelephone.

7. The antenna coupler of claim 5 wherein said externally accessible ground point is a ground pad of a battery charging port.

8. The antenna coupler of claim 1 wherein said means for coupling comprises a helical wire for surrounding said antenna.

9. The antenna coupler of claim 8 wherein said externally accessible ground point is an assembly screw which penetrates an internal electromagnetic shield of said portable radiotelephone.

10. The antenna coupler of claim 8 wherein said externally accessible ground point is a ground pad of a battery charging port.

11. An antenna coupler for coupling radio frequency signals from a communication device having an antenna and at least one externally accessible ground point, said antenna having an electrically conductive internal portion encased in an insulative material, said antenna coupler comprising:
    a ground plane;
    a metal pin, mounted on a top face of said ground plane, for coupling radio signals to and from said antenna; and
    at least one ground pin, coupled to said top face of said ground plane, for contacting said externally accessible ground point.

12. The antenna coupler of claim 11 wherein said externally accessible ground point is an assembly screw which penetrates an internal electromagnetic shield of said portable radiotelephone.

13. The antenna coupler of claim 11 wherein said externally accessible ground point is a ground pad of a battery charging port.

14. A communication device adapter for coupling radio frequency signals from a communication device having an antenna and at least one externally accessible ground point, said communication device adapter comprising:
    a base element having a ground plane;
    means, mounted on a top face of said ground plane, for coupling radio signals to and from said antenna;
    at least one ground pin, coupled to said top face of said ground plane, for contacting said externally accessible ground point; and
    a housing assembly, enclosing said base element, said housing assembly having a receptacle on a top face for receiving said communication device such that said antenna is positioned in proximity to said means for coupling radio signals and said at least one ground pin contacts said externally accessible ground point.

15. The antenna coupler of claim 14 wherein said means for coupling comprises a plurality of upward facing curved bands of metal, at least one of said curved bands of metal being electrically isolated from said ground plane.

16. The antenna coupler of claim 15 wherein said externally accessible ground point is an assembly screw which penetrates an internal electromagnetic shield of said portable radiotelephone.

17. The antenna coupler of claim 15 wherein said externally accessible ground point is a ground pad of a battery charging port.

18. The antenna coupler of claim 14 wherein said means for coupling comprises a metal pin for physically contacting said antenna.

19. The antenna coupler of claim 18 wherein said externally accessible ground point is an assembly screw which penetrates an internal electromagnetic shield of said portable radiotelephone.

20. The antenna coupler of claim 18 wherein said externally accessible ground point is a ground pad of a battery charging port.

21. The antenna coupler of claim 14 wherein said means for coupling comprises a helical wire for surrounding said antenna.

22. The antenna coupler of claim 21 wherein said externally accessible ground point is an assembly screw which penetrates an internal electromagnetic shield of said portable radiotelephone.

23. The antenna coupler of claim 21 wherein said externally accessible ground point is a ground pad of a battery charging port.

* * * * *